(12) United States Patent
Hayashi

(10) Patent No.: US 7,781,967 B2
(45) Date of Patent: Aug. 24, 2010

(54) ORGANIC ELECTROLUMINESCENCE DEVICE HAVING AN IMPROVED BARRIER STRUCTURE, AND MANUFACTURING METHOD THEREFORE AND ELECTRONIC APPARATUS

(75) Inventor: Kenji Hayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 451 days.

(21) Appl. No.: 11/781,600

(22) Filed: Jul. 23, 2007

(65) Prior Publication Data

US 2008/0054785 A1   Mar. 6, 2008

(30) Foreign Application Priority Data

Aug. 30, 2006   (JP)   .............................. 2006-234569

(51) Int. Cl.
*H01J 1/62* (2006.01)
*H01L 33/30* (2010.01)
*H05B 33/10* (2006.01)

(52) U.S. Cl. ........................ 313/512; 313/504; 313/506; 313/507; 428/690

(58) Field of Classification Search .................. None
See application file for complete search history.

(56) References Cited

U.S. PATENT DOCUMENTS

| | | | |
|---|---|---|---|
| 6,697,039 B1 * | 2/2004 | Yamakawa et al. ............ 345/98 |
| 6,992,439 B2 | 1/2006 | Yamazaki et al. | |
| 7,102,176 B2 | 9/2006 | Kubota | |
| 7,333,167 B2 | 2/2008 | Kawase | |
| 2003/0164674 A1 * | 9/2003 | Imamura .................... 313/493 |
| 2004/0212759 A1 * | 10/2004 | Hayashi ...................... 349/84 |
| 2005/0005848 A1 | 1/2005 | Yamazaki et al. | |
| 2006/0011136 A1 | 1/2006 | Yamazaki et al. | |
| 2006/0135029 A1 * | 6/2006 | Harada ......................... 445/25 |
| 2006/0158108 A1 * | 7/2006 | Hayashi ...................... 313/506 |
| 2006/0199461 A1 | 9/2006 | Yamazaki et al. | |
| 2006/0270213 A1 | 11/2006 | Kubota | |
| 2008/0067585 A1 | 3/2008 | Kawase | |

FOREIGN PATENT DOCUMENTS

| | | |
|---|---|---|
| JP | A-2000-030858 | 1/2000 |
| JP | A-2001-284041 | 10/2001 |
| JP | A-2002-324666 | 11/2002 |
| JP | A-2003-017244 | 1/2003 |
| JP | A-2003-203762 | 7/2003 |

(Continued)

*Primary Examiner*—Sikha Roy
*Assistant Examiner*—Tracie Green
(74) *Attorney, Agent, or Firm*—Oliff & Berridge, PLC

(57) ABSTRACT

An organic electroluminescence device includes an element substrate including a plurality of light-emitting elements each having an organic luminescent layer held between a pair of electrodes, a sealing substrate opposed to the element substrate, and a peripheral seal layer provided in the peripheral portion between the element substrate and the sealing substrate, for fixing the element substrate and the sealing substrate, wherein an electrode protecting layer covering the light-emitting elements, an organic buffer layer covering the electrode protecting layer, and a gas barrier layer covering the organic buffer layer are formed, the gas barrier layer is formed in a region wider than that of the organic buffer layer, the peripheral seal layer is provided on the gas barrier layer, and the peripheral edge of the organic buffer layer is disposed within the width of the peripheral seal layer

13 Claims, 7 Drawing Sheets

FOREIGN PATENT DOCUMENTS

| | | |
|---|---|---|
| JP | A-2003-282241 | 10/2003 |
| JP | A-2004-087153 | 3/2004 |
| JP | A-2004-327272 | 11/2004 |
| JP | A-2005-005166 | 1/2005 |
| JP | A-2005-116483 | 4/2005 |
| JP | A-2005-293946 | 10/2005 |
| JP | A-2006-028583 | 2/2006 |
| JP | A-2006-222071 | 8/2006 |
| WO | WO 03/030131 A1 | 4/2003 |

* cited by examiner

ORGANIC ELECTROLUMINESCENCE DEVICE HAVING AN IMPROVED BARRIER STRUCTURE, AND MANUFACTURING METHOD THEREFORE AND ELECTRONIC APPARATUS

BACKGROUND

1. Technical Field

The present invention relates to an organic electroluminescence device, a manufacturing method therefore and an electronic apparatus.

2. Related Art

The need for plane display devices with low power consumption and light weights has recently increased with diversification of information equipment. As one of such plane display devices, an organic electroluminescence device (referred to as an "organic EL device" hereinafter) provided with an organic luminescent layer is known. Such an organic EL device generally includes a luminescent layer provided between an anode and a cathode. Further, in order to the hole injection property and electron injection property there have been proposed a constitution including a hole injection layer disposed between an anode and a luminescent layer and a constitution including an electron injection layer disposed between a luminescent layer and a cathode.

Many materials used for a luminescent layer, a hole injection layer, and an electron injection layer of an organic EL device easily deteriorate due to reaction with atmospheric moisture. When such layers deteriorate, a non-emission region referred to as a "dark spot" is formed in the organic EL device, thereby decreasing the life as a light emitting device. Therefore, such an organic EL device has the problem that entrance of moisture and oxygen is prevented.

Therefore, a technique referred to as "thin film sealing" is used, in which a transparent thin film of silicon nitride, silicon oxide, or ceramic, which has excellent gas barrier performance, is deposited as a gas barrier layer on a light-emitting device by a high-density plasma deposition method (e.g., ion plating, ECR plasma sputtering, ECR plasma CVD, surface wave plasma CVD, or ICP-CVD) (refer to, for example, Japanese Unexamined Patent Application Publication Nos. 2001-284041, 2003-17244, 2003-203762, and 2005-293946).

Also, when the gas barrier layer is formed directly an element substrate including a pixel partition, cracks occur due to the irregular surface shape. In order to prevent the occurrence of cracks, an organic buffer layer is formed on the cement substrate, and then the gas barrier layer is formed thereon.

In recent years, in order to comply with smaller display bodies used for cellular phones and compact display bodies used for large televisions, there has been demand for narrowing as much as possible non-emission portions around pixels, i.e., so-called frame portions.

In particular, when a frame portion is narrowed as much as possible in a so-called "top emission structure" in which light emitted from an organic luminescent layer is emitted, through a color layer, from a sealing substrate opposed to an element substrate and displayed, a light shielding layer such as a black matrix is provided so as to prevent light leakage into the frame portion, for preventing leakage of light from the frame portion. Therefore, a window portion which transmits ultraviolet light for curing cannot be formed in many cases.

Further, in a rising portion at the peripheral edge of an organic buffer layer, a gas barrier layer is not flat and thus has an angle, thereby easily damaging the gas barrier layer.

SUMMARY

An advantage of some aspects of the invention is that the invention provides an organic electroluminescence device capable of narrowing a frame portion while preventing damage to a gas barrier layer, a manufacturing method therefore, and an electronic apparatus.

In accordance with an embodiment of the invention, an organic electroluminescence (EL) device includes an element substrate including a plurality of light-emitting elements each having an organic luminescent layer held between a pair of electrodes, a sealing substrate opposed to the element substrate, and a peripheral seal layer provided in the peripheral portion between the element substrate and the sealing substrate, for fixing t-e element substrate and the sealing substrate. In the organic EL device, an electrode protecting layer covering the light-emitting elements, an organic buffer layer covering the electrode protecting layer, and a gas barrier layer covering the organic buffer layer are formed, the gas barrier layer is formed in a region wider than that of the organic buffer layer, the peripheral seal layer is provided on the gas barrier layer, and the peripheral edge of the organic buffer layer is disposed within the width of the peripheral seal layer.

In the organic EL device, since the gas barrier layer covering the peripheral portion of the organic buffer layer is reinforced by the peripheral seal layer, it may be possible to prevent damage to the gas barrier, such as cracking or peeling due to stress concentration.

Further, since the peripheral edge of the organic buffer layer is disposed within the width of the peripheral seal layer, it may be possible to decrease a frame portion serving as a non-emission portion. Therefore, attempts may be made to miniaturize terminals and make large televisions compact, thereby causing the effect of improving the degree of design freedom.

Since the peripheral seal layer is composed of an ultraviolet curable resin, the viscosity may be increased by ultraviolet irradiation before bonding of the element substrate and the sealing substrate, for preventing rupture of the peripheral seal layer during the bonding.

An adhesive layer composed of a thermosetting resin may be formed inside the peripheral seal layer between the element substrate and the sealing substrate, for improving the adhesion between the element substrate and the sealing substrate. Also, it may be possible to prevent the entrance of moisture in the region surrounded by the peripheral seal layer between the element substrate and the sealing substrate. Further, it may be possible to fix the sealing substrate above the gas barrier layer and provide a buffer function for external mechanical impact, thereby protecting the organic luminescent layer and the gas barrier layer.

The peripheral seal layer or the adhesive layer contains spherical particles with a predetermined particle size for controlling the distance between the element substrate and the sealing substrate. Since the particles are composed of an organic material, in a top-emission structure, the distance between the element substrate and the sealing substrate may be controlled for efficiently emitting light and preventing damage to the gas barrier layer.

The gas barrier layer is composed of a silicon compound, and thus it may be possible to secure transparency, gas barrier property, and water resistance.

Since the contact angle at the peripheral edge of the organic buffer layer is 20° or less, it may be possible to suppress rising of the peripheral edge and prevent peeling. Also, it may be possible to decrease irregularity of the gas barrier layer covering the peripheral edge of the organic buffer layer, thereby suppressing damage.

In accordance with another embodiment of the invention, a method of manufacturing an organic electroluminescence (EL) device including an element substrate including a plurality of light-emitting elements each having an organic luminescent layer held between a pair of electrodes, and a sealing substrate opposed to the element substrate includes forming an electrode protecting layer covering the light-emitting elements on the element substrate, forming an organic buffer layer covering the electrode protecting layer, forming a gas barrier layer covering the organic buffer layer, applying a material for forming a peripheral seal layer on the sealing substrate, and bonding together the element substrate and the sealing substrate so that the peripheral edge of the organic buffer layer is disposed within the width of the peripheral seal layer.

In the method for manufacturing the organic EL device, the layers ranging to the gas barrier layer are laminated on the element substrate, the material for forming the peripheral seal layer is applied on the sealing substrate, and then the element substrate and the sealing substrate are bonded together. Therefore, the peripheral seal layer is formed above the peripheral edge of the organic buffer layer.

The step of forming the peripheral seal layer on the sealing substrate includes applying an ultraviolet curable resin used as the material for forming the peripheral seal layer on the peripheral portion of the sealing substrate, applying a thermosetting resin used as a material for forming an adhesive layer inside the peripheral seal layer, irradiating the peripheral seal layer with ultraviolet light, and then bonding together the element substrate and the sealing substrate. The step of bonding together the element substrate and the sealing substrate includes bonding together the element substrate and the sealing substrate under reduced pressure during curing of the peripheral seal layer and curing the peripheral layer and the adhesive layer by heating in air.

Before the element substrate and the sealing substrate are bonded together, the peripheral seal layer is pre-cured by ultraviolet irradiation to increase the viscosity of the peripheral seal layer. Therefore, the viscosity is low during coating so as to permit a high-speed drawing operation, and the viscosity is increased during bonding to improve the bonding position a precision and prevent projection of the adhesive layer. Even when the width region of the peripheral seal layer on the sealing substrate is shielded by a black matrix for preventing light leakage From the frame portion, curing of the peripheral seal layer may be proceeded by ultraviolet irradiation before bonding.

Since the peripheral seal layer and the adhesive layer are cured by heating after the element substrate and the sealing substrate are bonded together, it may be possible to improve adhesion, heat resistance, and moisture resistance while maintaining positional precision. Further, the element substrate and the sealing substrate are bonded together under reduced pressure, followed by curing in air. Thus, the adhesive layer spreads without a space in the region surrounded by the peripheral seal layer, thereby preventing mixing of bubbles and moisture.

In accordance with a further embodiment of the invention, an electronic apparatus Includes an organic EL device according to an embodiment of the invention. It may be possible to provide an electronic apparatus including a display portion having high-quality image characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
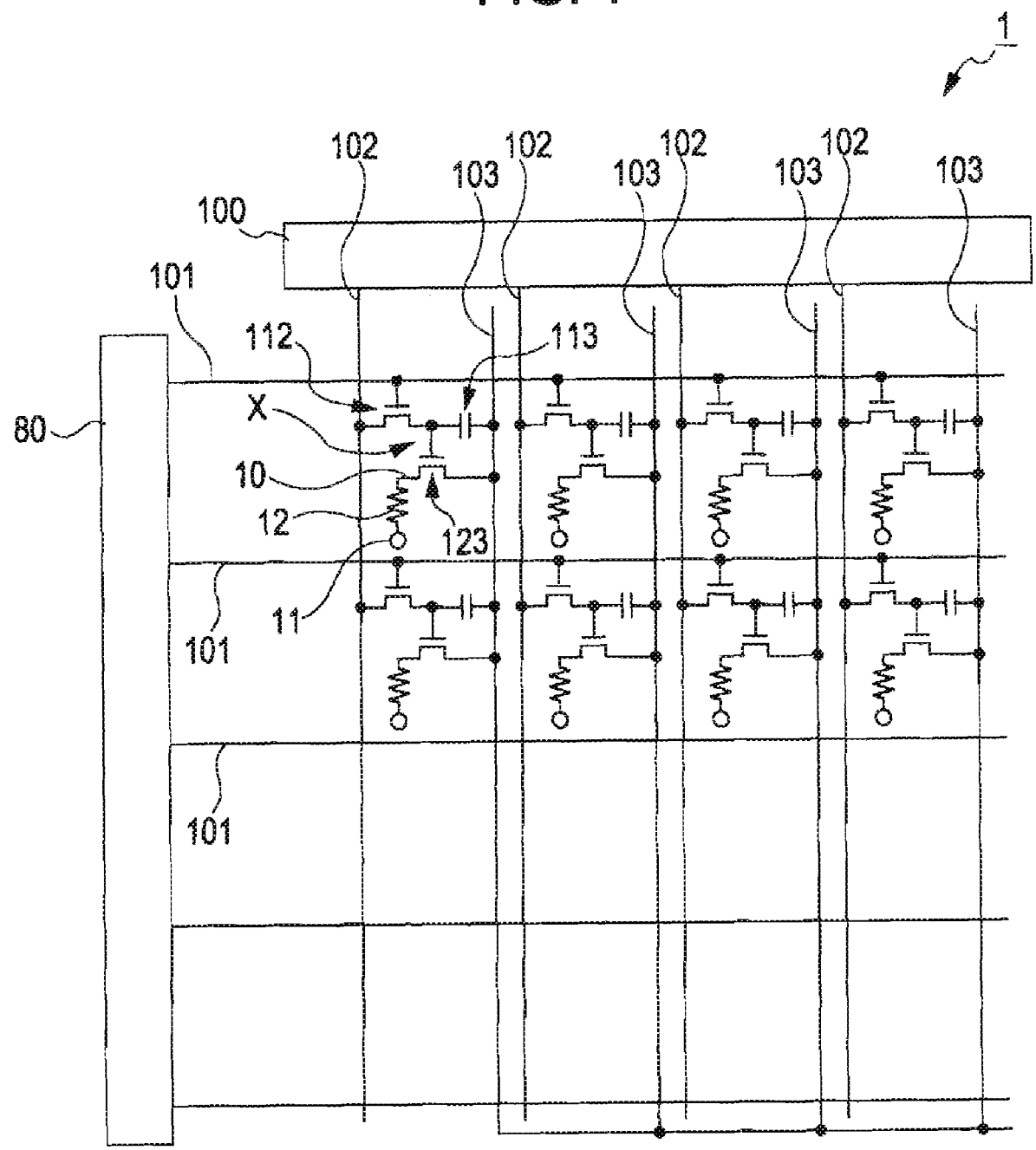
FIG. 1 is a schematic view showing a wiring structure of an organic EL device according to a first embodiment of the invention.

The invention will be described in detail below.

Although embodiments of the invention will be described, the invention is not limited to these embodiments, and any modification may be made within the scope of the technical idea of the invention. In each of the drawings, layers and members are shown on different reduced scales in order to make each of the layers and members recognizable in the drawings.

Organic EL Device According to First Embodiment

First, an organic EL device according to a first embodiment of the invention will be described.

FIG. 1 is a schematic view showing a wiring structure of an organic EL device according to this embodiment. In FIG. 1, reference numeral 1 denotes an organic EL device.

The organic EL device 1 is an active matrix type using thin film transistors (referred to as "TFT" hereinafter) as switching elements and has a wiring structure including a plurality of scanning lines 101, a plurality of signal lines 102 extending vertically to the scanning lines 101, and a plurality of power supply lines 103 extending in parallel with the respective signal lines 102. A pixel region X is formed near each of the intersections of the scanning lines 101 and the signal lines 102.

According to the technical idea of the invention, an active matrix using TFTs is not necessarily provided, and the invention may be carried out using an element substrate for a simple matrix. Simple matrix driving produces the same effect as in the active matrix at low cost.

In addition, a data line driving circuit 100 including a shift register, a level shifter, a video line, and an analogue switch is connected to the signal lines 102. Further, a scanning line driving circuit 80 including a shift register and a level shifter is connected to the scanning lines 101.

Further, each of the pixel regions X is provided with a switching TFT (switching element) 112 in which a scan signal is supplied to a gate electrode through the corresponding scanning line 101, a hold capacitor 113 for holding a pixel signal supplied from the corresponding signal line 102 through the switching TFT 112, a driving TFT (switching element) 123 in which the pixel signal held by the hold capacitor 113 is supplied to a gate electrode, an anode 10 to which a drive current flows from the corresponding power supply line 103 when the anode 10 is electrically connected to the power supply line 103 through the driving TFT 123, and a luminescent layer (organic luminescent layer) 12 sandwiched between the anode 10 and a cathode 11.

In the organic EL device 1, when the scanning lines 101 are driven to turn on the switching TFTs 112, the potentials of the signal lines 102 are held by the hold capacitors 113. The on-off states of the driving TFTs 123 are determined according to the states of the hold capacitors 113. Further, currents flow to the anodes 10 from the power supply lines 103 and further flow to the cathodes 11 through the luminescent layers 12. The luminescent layers 12 emit light according to the quantities of flowing currents.

Figure 2:
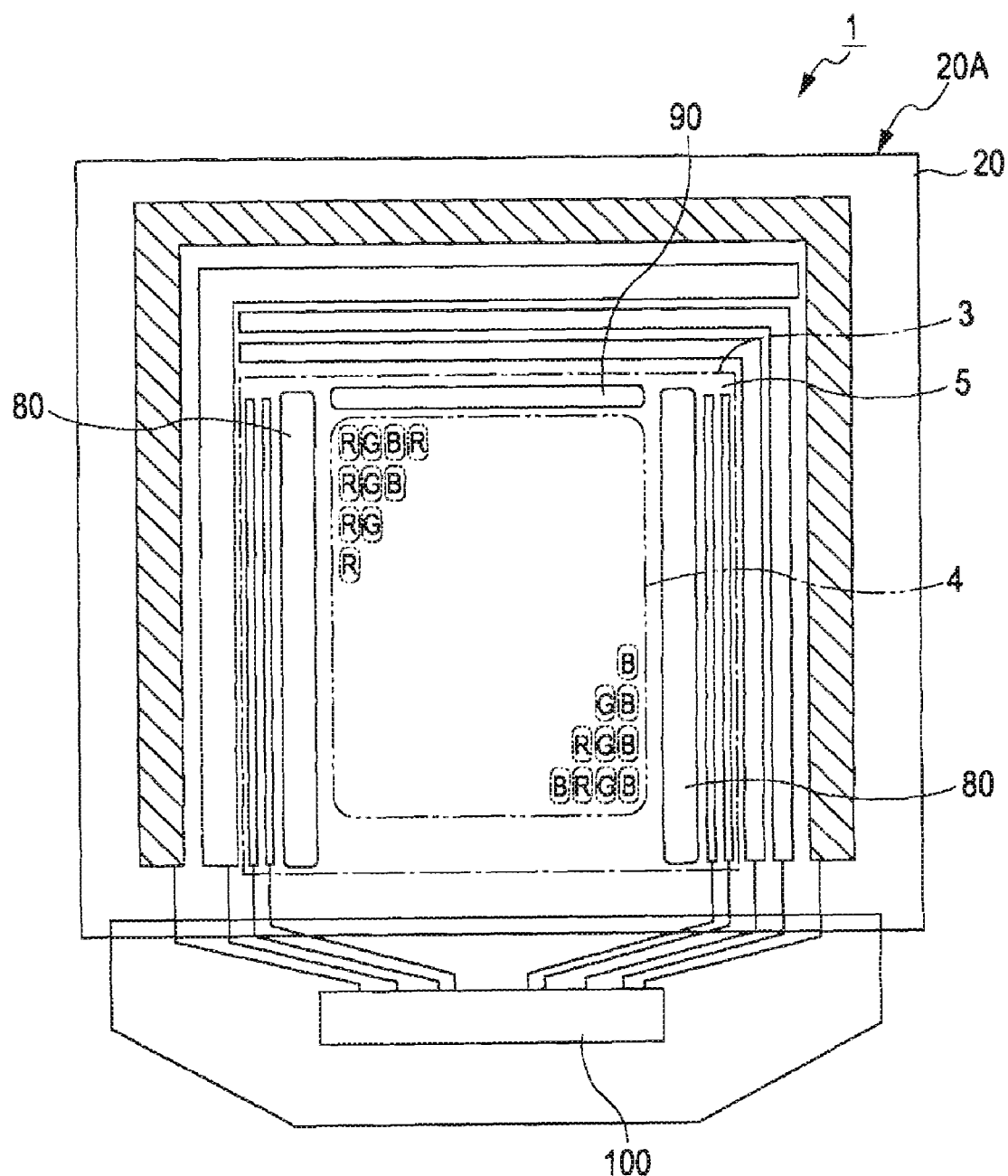
FIG. 2 is a schematic plan view showing the configuration of the organic EL device according to the first embodiment of the invention.
Figure 3:
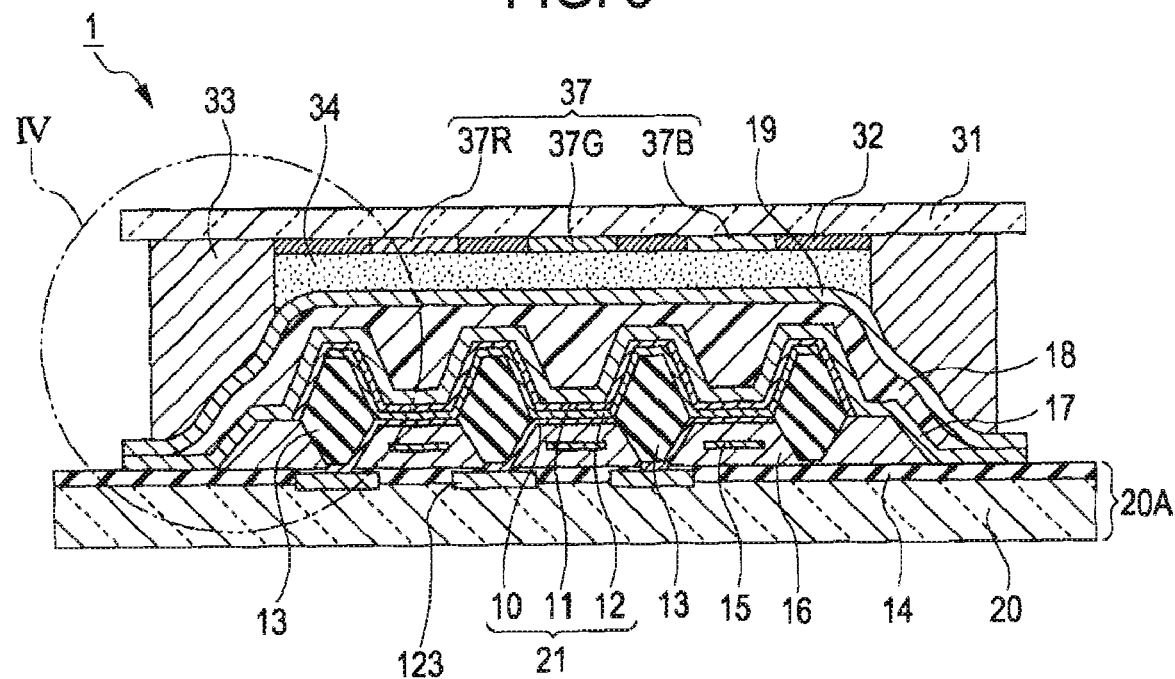
FIG. 3 is a schematic sectional view showing the configuration of the organic EL device according to the first embodiment of the invention.
Figure 4:
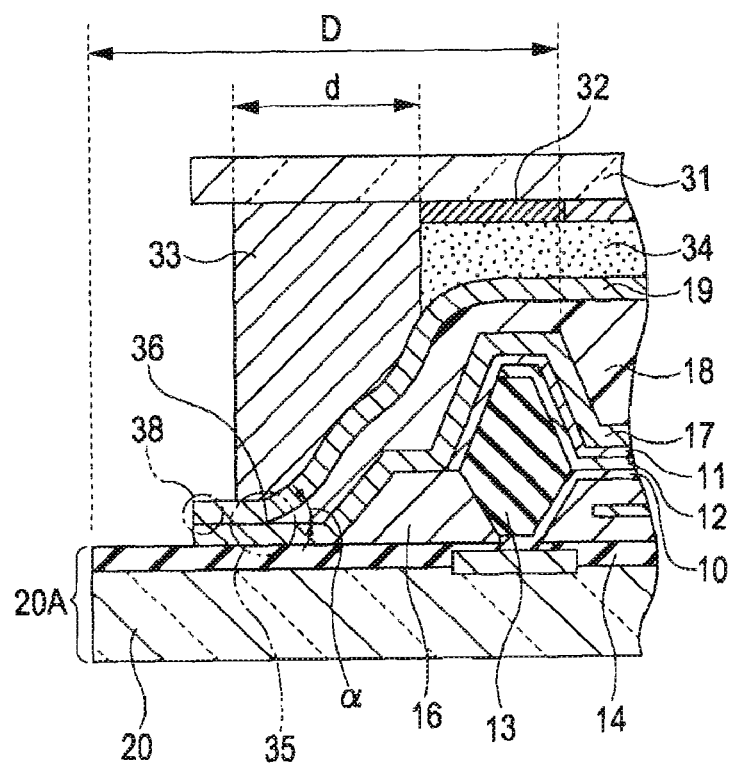
FIG. 4 is an enlarged sectional view of portion IV shown in FIG. 3 according to the first embodiment of the invention.

Next, the organic EL device 1 according to this embodiment will be described in further detail with reference to FIGS. 2 to 4. FIG. 2 is a schematic plan view showing the configuration of the organic EL device 1. FIG. 3 is a schematic sectional view showing the organic EL device 1. FIG. 4 is an enlarged sectional view showing a principal portion (portion IV) shown in FIG. 3, for illustrating the configuration of the peripheral portion of the organic EL device 1.

The configuration of the organic EL device 1 will be described with reference to FIG. 2.

FIG. 2 shows a TFT element substrate (referred to as an "element substrate" hereinafter) 20A in which the luminescent layers 12 emit light through the wiring, TFTs, and circuits formed on a substrate body 20.

The element substrate 20A of the organic EL device is provided with an actual display region 4 (within a frame shown by a two-dot chain line in FIG. 2) at the central portion and a dummy region 5 (a region between a one-dot chain line and the two-dot chain line) disposed around the actual display region 4.

Each of the pixel regions X shown in FIG. 1 emits light of any one of red (R), green (G), and blue (B) and forms any one of display regions R, G, and B shown in FIG. 2. In the actual display region 4, the display regions R, G, and B are arranged in a matrix. The display regions R, G, and B are arrayed so that the display regions arranged in the longitudinal direction of the drawing are the same color, thereby forming a so-called stripe arrangement. The three display regions R, G, and B are combined to form a display unit pixel so that lights of R, G, and B are mixed in each display unit pixel to produce a full-color display.

Further, the scanning line driving circuits 80 are disposed on both sides of the actual display region 4 shown in FIG. 2 and on the lower layer side of the dummy region 5. Further, an inspection circuit 90 is disposed on the top side of the actual display region 4 shotgun in FIG. 2 and on the lower layer side of the dummy region 5. The inspection circuit 90 is adapted for inspecting the operation conditions of the organic EL device 1. For example, the inspection circuit 90 includes an inspection information output unit (not shown in the drawing) which outputs inspection results to the outside, for inspecting the quality and defects of the organic EL device 1 in the course of manufacture and during shipment.

(Sectional Structure)

Next, the sectional structure of the organic EL device 1 will be described with reference to FIG. 3.

The organic EL device 1 according to this embodiment is a so-called top-emission structure organic EL device. The top-emission structure has the effect of securing a wide emission area without the influence of the size of each of the circuits disposed on the element substrate because light is emitted from the sealing substrate side, not the element substrate side. Therefore, it may be possible to secure luminance while suppressing the voltage and current, thereby increasing the lifetime of light emitting elements.

The organic EL device 1 includes the element substrate 20A including a plurality of light-emitting elements 21 each having a luminescent layer 12 (organic luminescent layer) provided between the anode 10, and the cathode 11, and a pixel partition 13 for partitioning the light-emitting elements 21; and a sealing substrate 31 opposed to the element substrate 20A.

(Element Substrate)

As shown in FIG. 3, the organic EL device 1 includes an inorganic insulating layer 14 composed of silicon nitride and provided to cover the element substrate 20A on which the various types of wiring (e.g., the TFTs) have been formed. In addition, contact holes (not shown) are formed in the inorganic insulating layer 14 so that the anodes 10 are connected to the respective driving TFTs 123. Further, a planarizing layer 16 including metal reflecting plates 15 which are composed of an aluminum alloy is formed on the inorganic insulating layer 14.

The anodes 10 and the cathodes 11 are formed with the luminescent layers 12 provided therebetween to form the light-emitting elements 21 on the planarizing layer 16. The insulating pixel partition 13 is arranged to partition the light-emitting elements 21.

In this embodiment, each of the anodes 10 includes a conductive film of a metal oxide such as ITO (Indium Tin Oxide) having a work function of 5 eV or more and a high hole injection effect.

In this embodiment, the anodes 10 are not necessarily made of a light-transmitting material because of the top-emission structure, and a metal electrode composed of aluminum may be used. In this case, the metal reflecting plates 15 need not be provided.

In this embodiment, the material for forming the cathodes 11 is preferably a light-transmitting material because of the top-emission structure, and thus a transparent conductive material is used. As the transparent conductive material, ITO is preferred, but other materials such as indium oxide-zinc oxide-based amorphous transparent conductive film (Indium Zinc Oxide: IZO (trade name)), may be used. In this embodiment, ITO is used.

The cathodes 11 are preferably made of a material having a high electron injection effect (a work function of 4 eV or less). Examples of such a material include metals such as calcium, magnesium, sodium, and lithium, and metal compounds thereof. The metal compounds include metal fluorides such as calcium fluoride, metal oxides such as lithium oxide, and organic metal complexes such as calcium acetylacetonate. Since such a material does not function as an electrode because of the high electric resistance, a metal layer of aluminum, gold, silver, or copper may be patterned so as to avoid light emission portions, or a laminate with a transparent conductive layer of a metal oxide such as ITO or tin oxide may be used. In this embodiment, a laminate of lithium fluoride, magnesium-silver alloy, and ITO is used with a thickness controlled to provide transparency.

As the luminescent layer 12, a white luminescent layer emitting white light is used. The white luminescent layer is formed over the entire surface of the element substrate 20A using a vacuum evaporation process. As a white luminescent material, a styrylamine luminescent material and an anthracene dopant (blue) or a styrylamine luminescent material and a rubene dopant (yellow) may be used.

Further, a triarylamine (ATP) multimer hole injection layer, a TDP (triphenyldiamine) hole transport layer, and an aluminum quinolinol (Alq3) layer (electron transport layer) are preferably formed below or on the luminescent layers 12.

Further, an electrode protecting layer 17 is formed on the element substrate 20A to cover the light-emitting elements 21 and the pixel partition 13.

The electrode protecting layer 17 is preferably composed of a silicon compound such as silicon oxynitride in view of transparency, adhesion, and gas barrier property. The thickness of the electrode protecting layer 17 is preferably 100 nm or more, and the upper limit of the thickness is preferably 200 nm or less in order to prevent the occurrence of cracks due to stress produced by coating the pixel partition 13. In this embodiment, the electrode protecting layer 17 is formed as a single layer, but a plurality of layers may be laminated. For example, the electrode protecting layer 17 may include a lower layer having a low elastic modulus and an upper layer having high water resistance.

Further, an organic buffer layer 18 is formed on the electrode protecting layer 17 to cover the electrode protecting layer 17.

The organic buffer layer 18 is disposed to fill irregular portions of the electrode protecting layer 17 which is formed to have irregularity by the influence of the shape of the pixel partition 13 so as to have a substantially flat top surface. The organic buffer layer 18 has the function to reduce the stress produced due to curvature and volumetric expansion of the element substrate 20A and to prevent peeling of the electrode protecting layer 17 from the pixel partition 13 having an unstable shape. Since the top surface of the organic buffer layer 18 is substantially planarized, the gas barrier layer 19 which includes a hard coating film formed on the organic buffer layer 18 and which will be described below is also planarized. Therefore, there is no portion where stress is concentrated, thereby preventing the occurrence of cracks in the gas barrier layer 19.

As a raw material main component of the organic buffer layer 18 before curing, an organic compound material with excellent mobility which does not contain a solvent or a volatile component so as to be entirely used as a raw material for a polymer skeleton is preferably used because the organic buffer layer 18 is formed by screen printing in a vacuum atmosphere. Specifically, an epoxy monomer/oligomer containing an epoxy group and having a molecular weight of 3,000 or less is preferably used (definition of monomer: molecular weight of 1,000 or less, definition of oligomer: molecular weight of 1,000 to 3,000). Examples of such monomer or oligomer include bisphenol A epoxy oligomer, bisphenol F epoxy oligomer, phenol novolac epoxy oligomer, polyethylene glycol diglycidyl ether, alkyl glycidyl ether, 3,4-epoxycyclohexenylmethyl-3',4'-epoxycyclohexene carboxylate, and ε-caprolactone-modified 3,4-epoxycyclohexylmethyl-3',4'-epoxycyclohexane carboxylate. These are used alone or in combination of two or more.

As a curing agent which reacts with the epoxy monomer/oligomer, an agent which forms a cured film having excellent electric insulating and adhesion, high hardness and toughness, and excellent heat resistance is preferably used, and an addition polymerization type is preferred because of excellent transparency and little curing variation. Preferred examples of such an agent include acid anhydride curing agents, such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, and 3,3',4,4'-benzophenonetetracarboxylic dianhydride. When an alcohol having a high molecular weight and low volatility, such as 1,6-hexanediol, or an amine compound such as aminephenol is added in a trace amount as a reaction accelerator for promoting reaction (ring opening) of an acid anhydride, low-temperature curing is easily performed. The curing is performed by heating in the range of 60° C. to 100° C., and the cured film is composed of a polymer having an ester bond.

Further, a cation emission-type photopolymerization initiator, which is frequently used for reducing the curing time, may be used. However, the initiator preferably slowly reacts so as to prevent rapid curing shrinkage, and the cured product is finally formed by heat curing so that planarization proceeds by decreasing the viscosity by heating after coating.

Further, additives such as a silane coupling agent for improving adhesion between the electrode protecting layer 17 and the gas barrier layer 19, a water catch agent such as an isocyanate compound, and fine particles for preventing shrinkage during curing may be mixed. Because of printing formation under a reduced-pressure atmosphere, the water content is preferably adjusted to 100 ppm or less in order to prevent the occurrence of bubbles during coating.

The viscosity of each raw material is preferably 1,000 mPa·s (room temperature: 25° C.) or more. This is because the raw material is prevented from penetrating into the luminescent layers 12 immediately after coating, thereby preventing the occurrence of a non-emission region referred to as a "dark sport". The viscosity of the buffer layer 18 forming material containing these raw materials is preferably 500 to 20,000 mPa·s, particularly 2,000 to 10,000 mPa·s (room temperature).

The optimum thickness of the organic buffer layer is preferably 3 to 10 µm. The organic buffer layer 18 having a larger thickness prevents defects of the gas barrier layer 19 when foreign matter is mixed. However, when the thickness of the organic buffer layer 18 exceeds 10 µm, the distance between color layers 37, which will be described below, and the luminescent layers 12 is increased to increase leakage of light from the side surfaces, thereby decreasing the efficiency of light emission.

As a characteristic after curing, the elastic modulus of the organic buffer layer 18 is preferably 1 to 10 GPa. With the elastic modulus of 10 GPa or more, stress produced in planarization of the layer provided on the pixel partition 13 is not absorbed, while with elastic modulus of 1 GPa or less, abrasion resistance and heat resistance are insufficient.

The gas barrier layer 19 is formed on the organic buffer layer 18 in a wider range so as to cover the organic buffer layer 1r and the ends of the electrode protecting layer 17.

The gas barrier layer 19 is adapted for preventing entrance of oxygen and moisture, thereby suppressing deterioration of the light-emitting elements 21 due to oxygen and moisture. The gas barrier layer 19 is preferably composed of a nitrogen-containing silicon compound, i.e., silicon nitride or silicon oxynitride, in view of transparency, gas barrier property, and water resistance.

The elastic modulus of the gas barrier layer 19 is preferably 100 GPa or more, specifically about 200 to 250 GPa. The thickness of the gas barrier layer 19 is preferably about 200 to 600 nm. When the thickness is less than 200 nm, through holes may be formed due to insufficient coverage for foreign matter, thereby impairing the gas barrier property. When the thickness exceeds 600 nm, cracks may occur due to stress.

Further, the gas barrier layer 19 may have a laminated structure or a structure in which the composition is made nonuniform, and particularly, the oxygen concentration continuously or discontinuously changes. In the laminated structure, the thickness of a first gas barrier layer is preferably 200 to 400 nm. When the thickness is less than 200 nm, the surface and sides of the organic buffer layer 18 are not sufficiently covered. The thickness of a second gas barrier layer for improving coverage for foreign matter is preferably 200 to 800 nm. The total thickness of over 1,000 nm is undesirable from the viewpoint of increase in occurrence frequency of cracks and economy.

In this embodiment, the organic EL device 1 has a top-emission structure, and thus the gas barrier layer 19 has light transmittance. Therefore, in this embodiment, the material and thickness of the gas barrier layer 19 are appropriately controlled so that the light transmittance in the visible light region is, for example, 80% or more.

(Sealing Substrate)

Further, a sealing substrate 31 is opposed to the element substrate 20A on which the gas barrier layer 19 has been formed.

The sealing substrate 31 is made of a light-transmitting material such as glass or transparent plastic (polyethylene terephthalate, an acrylic resin, polycarbonate, or polyolefin) because the sealing substrate 31 has a display plane from which emitted light is led out.

Further, a red color layer 37R, a green color layer 37G, and a blue color layer 37B are arranged in a matrix as the color layer 37 on the lower surface of the sealing substrate 31. A black matrix 32 is formed around the color layer 37.

Each of the color layers 37 is opposed to the white luminescent layer 12 formed on the anode 10. Therefore, light emitted from the luminescent layer 12 is transmitted through each color layer 37 and emitted as red light, green light, or blue light to the observer side. In order to prevent leakage from the frame portion, the black matrix may be provided to cover the width of the peripheral seal layer 33.

In the organic EL device 1, a color display is produced using light emitted from the luminescent layers 12 and the color layers 37 of a plurality of colors.

Besides the color layers 37, the sealing substrate 31 may be provided with functional layers such as an ultraviolet shielding/absorption layer, a anti-reflecting layer, and a radiation layer.

The peripheral seal layer 33 is provided in the peripheral portion between the element substrate 20A and the sealing substrate 31.

The peripheral seal layer 33 has the function as a bank for improving the positional precision of bonding of the element substrate 20A and the sealing substrate 31 and for preventing projection of a filling layer 34 (adhesive layer) which will be described below. The peripheral seal layer 33 is composed of an epoxy material which is cured by ultraviolet light to increase the viscosity of the material. Preferably, an epoxy monomer/oligomer having an epoxy group and a molecular weight of 3,000 or less (definition of monomer: molecular weight of 1,000 or less, definition of oligomer: molecular weight of 1,000 to 3,000) is used. Specific examples includes bisphenol A epoxy oligomers, bisphenol F epoxy oligomers, phenol novolac epoxy oligomers, polyethylene glycol diglycidyl ether, alkyl glycidyl ether, 3,4-epoxycyclohexenylmethyl-3',4'-epoxycyclohexene carboxylate, and ε-caprolactone-modified 3,4-epoxycyclohexylmethyl-3',4'-epoxycyclohexane carboxylate. These are used alone or in combination of two or more.

As a curing agent which reacts with the epoxy monomer/oligomer, a photoreaction-type initiator which produces cationic polymerization reaction, such as a diazonium salt, a diphenyl iodonium salt, a triphenyl sulfonium salt, a sulfonate ester, an iron-arene complex, or a silanol/aluminum complex, is preferred. When a material which is gradually increased in viscosity after ultraviolet irradiation is used, it may be possible to prevent rapture of the peripheral seal layer 33 with a small seal width of 1 mm or less and prevent projection of a filler after bonding. In order to suppress the occurrence of bubbles in bonding under a reduced pressure, the water content is preferably controlled to 1,000 ppm or less.

The thickness of the peripheral seal layer 33 is preferably 10 to 25 μm In order to control the distance between the element substrate 20A and the sealing substrate 31, spherical particles composed of an organic material and having a predetermined particle size are preferably mixed. A sealing agent is generally mixed with scale-like or bulk particles of an inorganic material in order to increase the viscosity. However, the gas barrier layer 19 may be damaged in pressure bonding, and thus, in the organic EL device 1 according to this embodiment, spherical particles of an organic material with a low elastic modulus are mixed in the peripheral seal layer 33.

In addition, the filling layer 34 (adhesive layer) composed of a thermosetting resin is formed in the region surrounded by the peripheral seal layer 33 between tie element substrate 20A and the sealing substrate 31.

The filling layer 34 is filled in the region surrounded by the peripheral seal layer 33 In the organic EL device 1 without a space so as to have the function to fix the sealing substrate 31 opposed to the element substrate 20A, the buffer function for external mechanical impact, and the function to protect the light-emitting layers 12 and the gas barrier layer 19.

The filling layer 34 includes, as a raw material main component before curing, an organic compound material having excellent mobility and not containing a volatile component such as a solvent. Specifically, an epoxy monomer/oligomer containing an epoxy group and having a molecular weight of 3,000 or less is preferably used (definition of monomer: molecular weight of 1000 or less, definition of oligomer: molecular weight of 1000 to 3000). Examples of such monomer or oligomer include bisphenol A epoxy oligomer, bisphenol F epoxy oligomer, phenol novolac epoxy oligomer, polyethylene glycol diglycidyl ether, alkyl glycidyl ether, 3,4-epoxycyclohexenylmethyl-3',4'-epoxycyclohexene carboxylate, and ε-caprolactone-modified 3,4-epoxycyclohexylmethyl-3',4'-epoxycyclohexane carboxylate. These are used alone or in combination of two or more.

As the curing agent which reacts with the epoxy monomer-oligomer, an agent which forms a cured film having excellent electric insulation, high toughness, and excellent heat resistance is preferably used, and an addition polymerization type is preferred because of excellent transparency and little curing variation. Preferred examples of such an agent include acid anhydride curing agents such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, 3,3',4,4'-benzophenonetetracarboxylic dianhydride, and polymers thereof. The curing is performed in the range of 60° C. to 100° C., and the cured film is composed of a polymer having an ester bond and excellent adhesion to a silicon oxynitride. When a compound with a relatively high molecular weight, such as an aromatic amine, an alcohol, or aminephenol, is added as a curing accelerator for promoting ring opening of an acid anhydride, low-temperature curing is performed within a short time.

The viscosity in coating is preferably 100 to 1000 mPa·s (room temperature) in view of the property of material filling in the space after bonding, and a material which decreases in viscosity immediately after heating and then starts to be cured is preferred. In order to prevent the occurrence of bubbles in bonding under a reduced pressure, the water content of the material is preferably controlled to 100 ppm or less.

The thickness of the filling layer 34 is preferably 5 to 20 μm. The filling layer 34 1s preferably mixed with spherical particles with a predetermined particle size which are composed of an organic material, for controlling the distance between the element substrate 20A and the sealing substrate 31. Like the peripheral seal layer 33, the organic EL device 1 according to this embodiment contains organic material particles with low elastic modulus. When the filling layer 34 contains organic material particles with low elastic modulus, it may be possible to prevent damage to the gas barrier layer 19.

(Sectional Structure of Peripheral Portion)

Next, the sectional structure of the peripheral portion of the organic EL device 1 will be described with reference to FIG. 4.

As shown in FIG. 4, the peripheral portion of the organic EL device 1 has a structure in which the electrode protecting layer 17, the organic buffer layer 1, the gas barrier layer 19, and the peripheral seal layer 33 are laminated in order between the element substrate 20A and the sealing substrate 31.

The thickness of the organic buffer layer 18 decreases from the central portion to the peripheral edge 35. The elevation angle (contact angle) α at the peripheral edge 35 of the organic buffer layer 18 with respect to the horizontal direction of the element substrate 20A is preferably 20° or less, and particularly preferably about 10°. Therefore, it may be possible to prevent damage such as cracking or peeling due to the concentration of stress in the gas barrier layer 19 covering the organic buffer layer The gas barrier layer 19 is formed in a wider region than that of the organic buffer layer 18 so as to completely cover the organic buffer layer 18, and the peripheral seal layer 33 is disposed on the gas barrier layer 19. Further, the rising portion at the peripheral edge 35 of the organic buffer layer 18 is disposed within the width d of the peripheral seal layer 33. Thus, the gas barrier layer 19 covering the peripheral edge 35 of the organic buffer layer 18 is protected by the peripheral seal layer 33, thereby preventing damage such as cracking or peeling due to the concentration of stress in the gas barrier layer 19. Accordingly, moisture is prevented from passing through the gas barrier layer 19 and reaching the light-emitting elements 21, thereby preventing the occurrence of dark spots.

Although, in this embodiments the gas barrier layer 19 is formed to protrude from the peripheral end of the peripheral seal layer 33, the gas barrier layer 19 is not necessarily formed to protrude from the peripheral end of the peripheral seal layer 33. Namely, like the peripheral edge 35 of the organic buffer layer 18, the peripheral edge 38 of the gas barrier layer 19 may be disposed within the width d of the peripheral seal layer 33 as long as the peripheral edge 38 of the gas barrier layer 19 is disposed outside the peripheral edge 35 of the organic buffer layer 18. In addition, the width of the electrode protecting layer 17 is larger than that of the organic buffer layer 18. Since the electrode protecting layer 17 is generally formed using the same mask material as for the gas barrier layer 19, the electrode protecting layer 17 is formed with the same width as that of the gas barrier layer 19.

The peripheral portion of the organic EL device 1 is used as a frame portion (non-emission portion) D. The frame portion D corresponds to the non-emission portion of the organic EL device 1. For example, the frame portion D has a width covering from the pixel partition 13 provided at the end of the element substrate 20A to the end of the element substrate 20A. The frame portion D is formed with a width of, for example, 2 mm, and the width d of the peripheral seal layer is, for example 1 mm.

According to this embodiment, the peripheral seal layer 33 is disposed on the gas barrier layer 19, and thus it may be possible to obtain the organic EL device A having the narrow frame portion D and also form the organic EL device 1 having excellent heat resistance and moisture resistance as compared with the case in which the peripheral seal layer 33 is disposed outside the gas barrier layer 19. Also, since the bonding area between the element substrate 20A and the sealing substrate 31 is wider than that of a general can-sealed structure, it may be possible to form the peripheral seal layer 33 with the smaller width d while maintaining the strength of the organic EL device 1, thereby decreasing the frame portion D serving as the non-emission portion. Therefore, attempts may be made to miniaturize terminals such as a cellular phone and made compact display bodies of large televisions, thereby causing the effect of improving the degree of design freedom. Also, it may be possible to increase the number of the panels obtained from one mother board, thereby causing the effect of improving the material efficiency.

In order to prevent seal cut-off, the material of a general sealing agent contains Inorganic material particles mixed for increasing the viscosity. However, the peripheral seal layer 33 is composed of a material which is gradually increased in viscosity after ultraviolet irradiation, and thus the viscosity is increased by ultraviolet irradiation before bonding between the element substrate 20A and the sealing substrate 31. Therefore, it may be possible to prevent seal cut-off after bonding under reduced pressure while maintaining the high drawing speed of a dispenser.

Further, the filling layer 34 composed of a thermosetting resin is formed in the region surrounded by the peripheral seal layer 33 between the element substrate 20A and the sealing substrate 31, thereby improving the adhesion between the element substrate 20A and the sealing substrate 31 while suppressing the influence of curing shrinkage on each of the function layers such as the gas barrier layer 19 and the layers provided below it. Therefore, it may be possible to prevent the entrance of moisture into the region surrounded by the peripheral seal layer 33 between the element substrate 20A and the sealing substrate 31. Further, it may be possible to fix the sealing substrate 31, provide the buffer function for an external mechanical impact, and protect the luminescent layers 12 and the gas barrier layer 19.

Since spherical particles of an organic material having a predetermined particle size are mixed in each of the peripheral seal layer 33 and the filling layer 34, it may be possible to prevent damage to the gas barrier layer 19 and control the distance between the element substrate 20A and the sealing substrate 31. Therefore, the optical path from each of the luminescent layers 12 to the corresponding color layer 37 is kept constant and short. As a result, in the top-emission structure, light emitted from the luminescent layers 12 is efficiency emitted to the outside of the sealing substrate 31 without being incident on the black matrix layer 32, thereby improving the luminance of the organic EL device 1.

Since the gas barrier layer 19 is composed of a silicon compound, it may be possible to secure transparency, the gas barrier property, and water resistance.

Further, since the contact angle α at the peripheral edge 35 of the organic buffer layer 18 is 20° or less, it may be possible to suppress rising of the peripheral edge 35 and prevent peeling. Also, it may be possible to reduce the irregularity of the gas barrier layer 19 covering the peripheral edge 35 of the organic buffer layer 18, thereby suppressing damage.

(Method of Manufacturing Organic EL Device)

Next, the method of manufacturing the organic EL device 1 according to this embodiment will be described with reference to FIGS. 5 and 6. FIGS. 5A, 5B, and 5C are drawings showing manufacturing steps on the element substrate side of the organic EL device 1. FIGS. 6A, 6B, and 6C are drawings showing manufacturing steps on the sealing substrate side of the organic EL device 1.

Figure 5A:
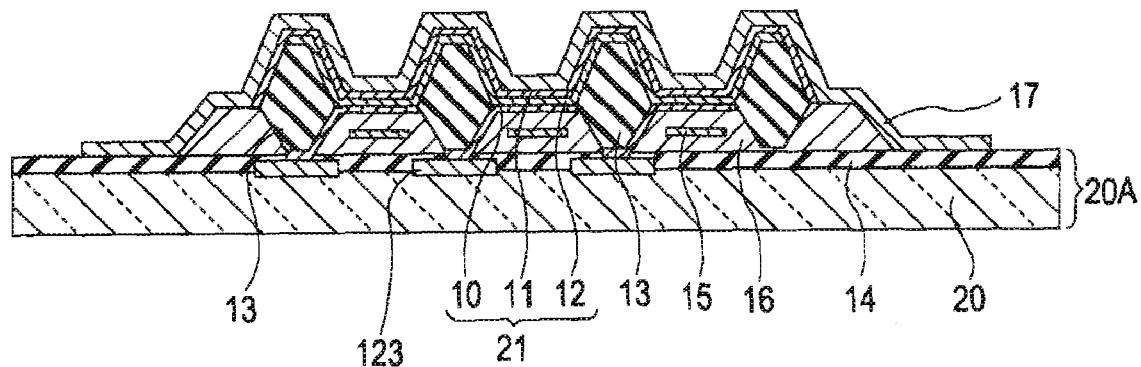
FIGS. 5A, 5B, and 5C are drawings showing manufacturing steps on the element substrate side of the organic EL device according to the first embodiment of the invention.

First, as shown in FIG. 5A, the electrode protecting layer 17 Is formed on the element substrate 20A on which the layers up to the cathodes 11 have been formed.

Specifically, for example, a nitrogen-containing silicon compound, i.e., silicon nitride or silicon oxynitride, is deposited by a high-density plasma deposition method such as ECR sputtering or ion plating.

A transparent inorganic material, such as organic oxide $SiO_2$ or an alkali halide, e.g., LiF or MgF, may be deposited by a vacuum evaporation or high-density plasma deposition method.

Figure 5B:
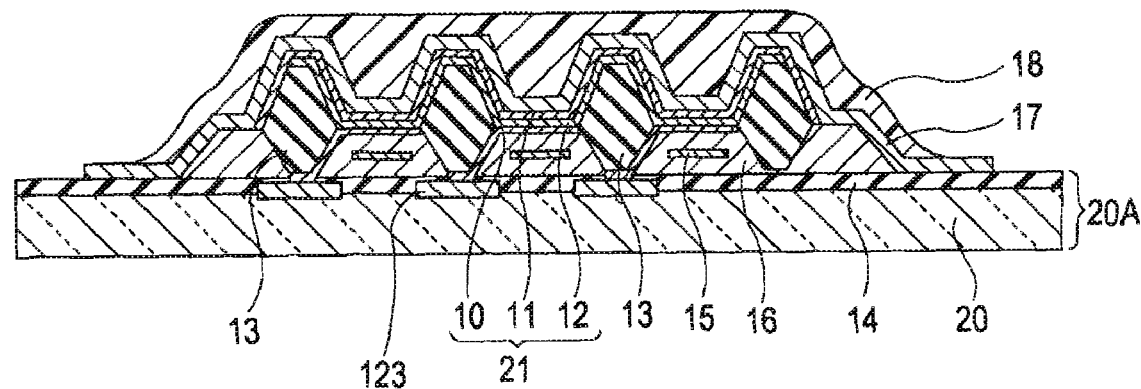

Next, as shown in FIG. 5B, the organic buffer layer 18 is formed on the electrode protecting layer 17.

Specifically, the organic buffer layer 18 formed by screen printing in a reduced-pressure atmosphere is cured by heating in the range of 60° C. to 100° C. This step has the problem of temporarily decreasing the viscosity immediately after heating before the start of reaction. Therefore, the material used for forming the organic buffer layer 18 passes through the electrode protecting layer 17 and the cathodes 11 and permeates into the luminescent layers 12 of Alp3, thereby causing dark spots. Therefore, it is preferred to allow the organic buffer layer 18 at a low temperature until curing proceeds to some extent and then increase the temperature for completely curing the layer when the viscosity is increased to some extent.

Figure 5C:
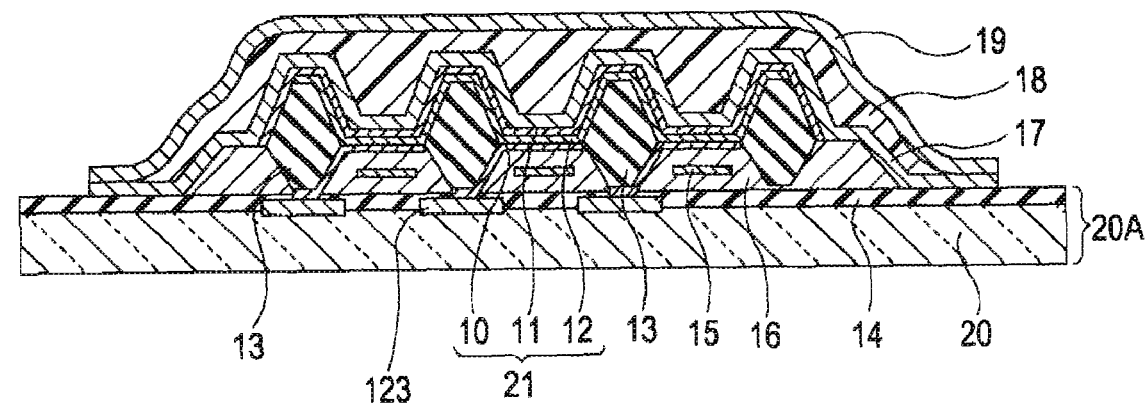

Next, as shown in FIG. 5C, the gas barrier layer 19 is formed on the organic buffer layer 18.

Specifically, the gas barrier layer 19 is formed by the high-density plasma deposition method such as ECR sputtering or ion plating. Before the formation, the adhesion is improved by oxygen plasma treatment for improving reliability.

Figure 6A:
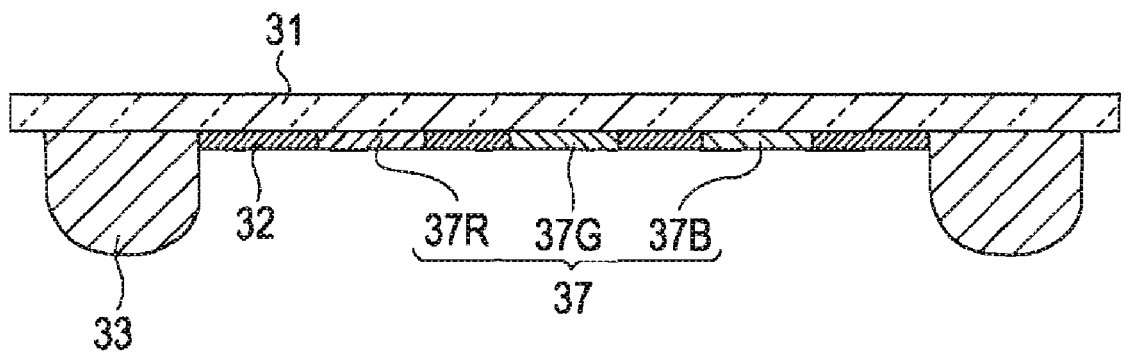
FIGS. 6A, 6B, and 6C are drawings showing manufacturing steps on the sealing substrate side of the organic EL device according to the first embodiment of the invention.

On the other hand, as shown In FIG. 6A, the peripheral seal layer 33 is formed in the peripheral portion of the sealing substrate 31 on which the color layers 37 and the black matrix 32 have been formed.

Specifically, the ultraviolet curable resin material is applied to the periphery of the sealing substrate 31 by a needle dispensing method. The application may be performed by screen printing.

Figure 6B:
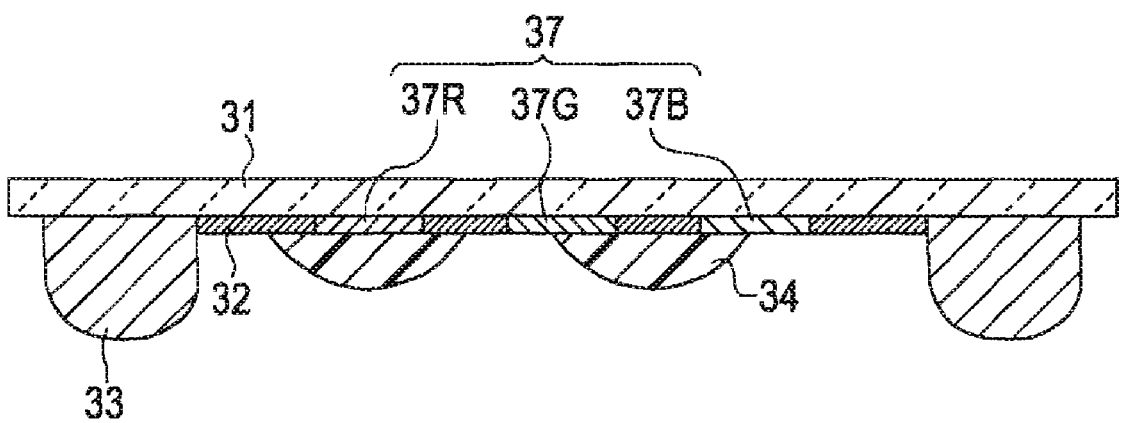

Next, as shown in FIG. 6B, the filling layer 34 is formed in the region surrounded by the peripheral seal layer 33 of the sealing substrate 31.

Specifically, the thermosetting resin material is applied by a jet dispensing method.

The thermosetting resin material need not be applied to the entire surface of the sealing substrate 31, and the resin material may be applied to a plurality of positions on the sealing substrate 31.

Figure 6C:
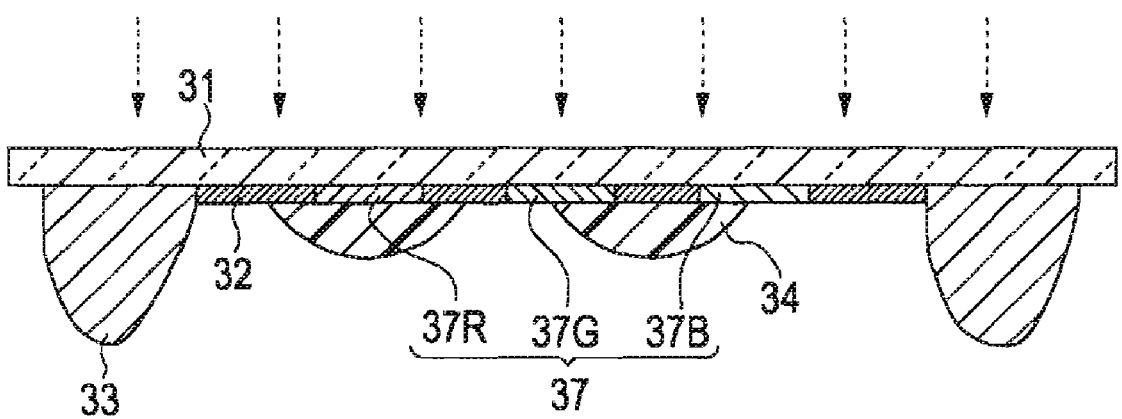

Next, as shown in FIG. 6C, the sealing substrate 31 on which the peripheral seal layer 33 and the filling layer 34 have been formed is irradiated with ultraviolet light.

Specifically, in order to temporarily cure the peripheral seal layer 33, the sealing substrate 31 is irradiated with ultraviolet light with, for example, an illumination of 30 MW/cm$^2$ and a, light quantity of 2000 MJ/cm$^2$. In this step, only the peripheral seal layer 33 composed of the ultraviolet curable resin is cured to increase the viscosity.

Next, the element substrate 20A on which the layers up to the gas barrier 19 have been formed as shown in FIG. 5C and the sealing substrate 31 on which the peripheral seal layer 33 has been temporarily cured as shown in FIG. 6C are bonded together. At this time, the peripheral seal layer 33 is disposed so as to completely cover the rising portion 36 at the peripheral edge 35 of the organic buffer layer 18 formed on the element substrate 20A.

Specifically, in the bonding step, both substrates are pressure-bonded by keeping for 200 seconds under a pressure of 600 N in a vacuum atmosphere with a degree of vacuum of, for example, 1 Pa.

Next, the organic EL device 1 subjected to pressure bonding is heated in air.

Specifically, the element substrate 20A and the sealing substrate 31 which have been bonded together is heated in air to thermally cure the pre-cured peripheral seal layer 33 and the filling layer 34.

Even if a vacuum space is present between the element substrate 20A and the sealing substrate 31, the space is filled with the filling layer 34 by heat curing in air. As a result, the desired organic EL device 1 according to this embodiment is obtained.

Therefore, according to the manufacturing method, the peripheral seal layer 33 is temporarily cured by ultraviolet irradiation to increase the viscosity of the peripheral seal layer 33 before the element substrate 20A and the sealing substrate 31 are bonded together Therefore, the viscosity is low during coating to permit a high-speed drawing operation, and the viscosity is increased in bonding, thereby improving the bonding positional precision and preventing projection of the filling layer 34. Also, it may be possible to form the peripheral seal layer 33 on the rising portion 36 at the peripheral edge 35 of the organic buffer layer 18. Furthermore, even when the region with the width of the peripheral seal layer 33 on the sealing substrate 31 is shielded by the black matrix layer 32 for preventing light leakage from the frame portion D, curing of the peripheral seal layer 33 may be proceeded by ultraviolet irradiation before bonding.

In addition, since the peripheral seal layer 33 and the filling layer 34 are heat--cured after bonding of the element substrate 20A and the sealing substrate 31, it may be possible to improve adhesion, heat resistance, and moisture resistance while maintaining the positional precision. Further, since the element substrate 20A and the sealing substrate 31 are bonded together under a reduced pressure and then subjected to curing in air, the filling layer 34 is spread without a space in the region surrounded by the peripheral seal layer 33 due to a pressure difference between a vacuum atmosphere and the air, thereby preventing mixing of bubbles and moisture.

Organic EL Device According to Second Embodiment

Figure 7:
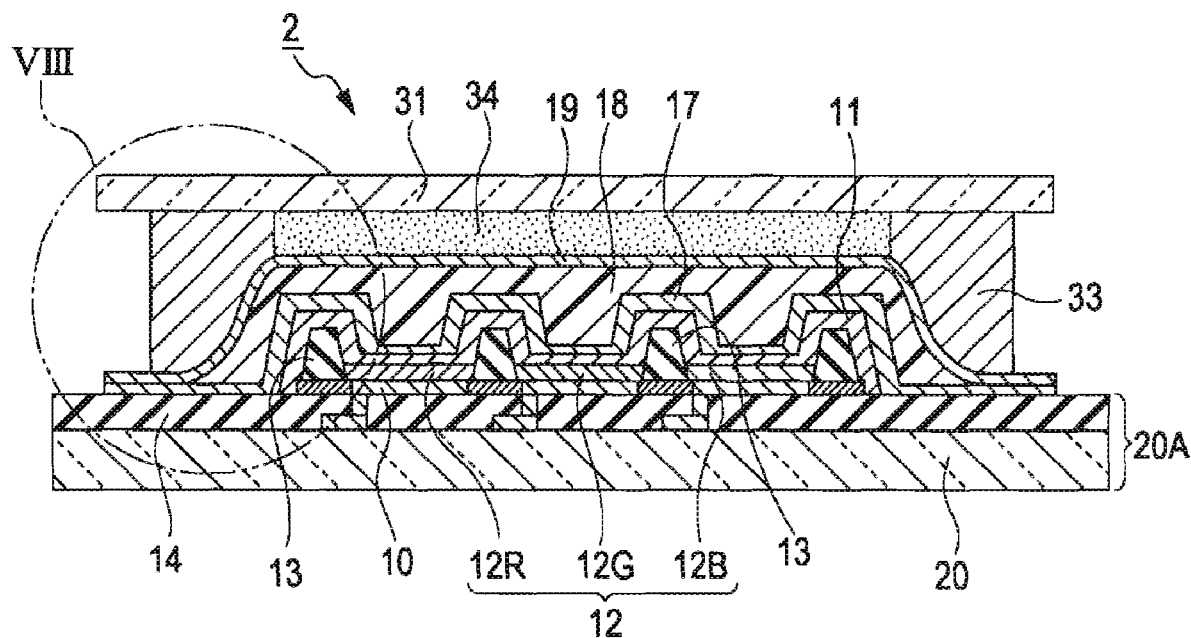
FIG. 7 is a schematic sectional view showing the configuration of an organic EL device according to a second embodiment of the invention.
Figure 8:
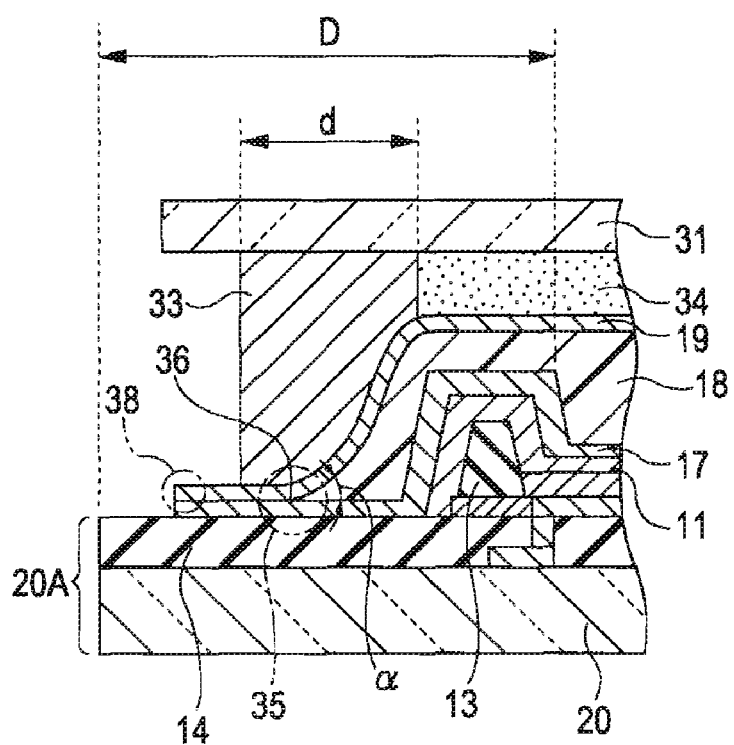
FIG. 8 is an enlarged sectional view of portion VIII shown in FIG. 7 according to the second embodiment of the invention.

Next, an organic EL device 2 according to a second embodiment of the invention will be described. In this embodiment, the same components as in the first embodiment are denoted by the same reference numerals, and the description thereof is omitted. FIG. 7 is a schematic sectional view showing the organic EL device 2, and FIG. 8 is a sectional view of a principal portion (portion VIII) shone in FIG. 7, for illustrating the configuration of the peripheral portion of the organic EL device 2.

The organic EL device 1 according to the first embodiment has the top-emission structure in which each luminescent layer 12 includes a white luminescent layer, and the sealing substrate 31 has the color layers 37 and the black matrix layer 32.

The organic EL device 2 according to the second embodiment has a so-called bottom emission structure and is different from the organic EL device 1 in that the luminescent layers 12 include a red luminescent layer 12R, a green luminescent layer 12G, and a blue luminescent layer 12B.

As shown in FIG. 7, the organic EL device 2 includes the element substrate 20A on which the various types of wiring (e.g., TFT) are formed and covered with the inorganic insulating layer 14 composed of silicon nitride. In addition, on the element substrate 20A, each of the luminescent layers 12 is held between a pair of electrodes i.e., the anode 10 and the cathode 11. The luminescent layers 12 are partitioned by the pixel partition 13 formed on the inorganic insulating layer 14 so that the red luminescent layer 12R, the green luminescent layer 12G, and the blue luminescent layer 12B are arranged as the luminescent layers 12.

In this embodiment, as a material for forming the luminescent layers 12, a known luminescent material capable of emitting fluorescence or phosphorescence is used. The red luminescent layer 12R, the green luminescent layer 12G, and the blue luminescent layer 12B are provided for a plurality of anodes 10 to permit a full-color display.

Preferred examples of the material for forming the luminescent layers 12 include polymer materials such as (poly) fluorene derivatives (PF), (poly)paraphenylene vinylene derivatives (PPV), polyphenylene derivatives (PP), polyparaphenylene derivatives (PPP), polyvinyl carbazole (PVK), polythiophene derivatives, and polysilane such as polymethylphenylsilane (PMPS). These polymer materials may be doped with a polymer material such as a perylene dye, a coumarin dye, or a rhodamine dye, or a low-molecular material such as rubrene, perylene, 9,10-diphenylanthracene, tetraphenylbutadiene, Nile red, coumarin 6, or quinacridon. As the low-molecular material, a host material such as Alq3 or DPVBi may be doped with Nile red, DCM, rubrene, perylene, or rhodamine or may be used alone in a vapor deposition method.

Further, for example, MEHPPV (poly(3-methoxy-6-(3-ethylhexyl)paraphenylene vinylene) may be used as a material for forming the red luminescent layer 12R, a mixed solution of polydioctylfluorene and F8BT (alternating copolymer of dioctylfluorence and benzothiadiazole) may be used as a material for forming the green luminescent layer 12G, and polydioctylfluorene may be used as a material for forming the blue luminescent layer 12B. The thickness of the luminescent layers 12 is not particularly limited, and the luminescent layer of each color is controlled to a desired thickness.

The configuration above the luminescent layers 12 is the same as in the first embodiment. However, in this embodiment, emitted light is emitted from the element substrate 20A because of the bottom-emission structure. Therefore, the upper layer portion need not include a light-transmitting material.

(Sectional Structure of Peripheral Portion)

Next, the sectional structure of the peripheral portion of the organic EL device 2 will be described with reference to FIG. 8.

As shown in FIG. 8, like in the first embodiment, in the organic EL device 2, the thickness of the organic buffer layer 18 decreases from the central, portion to the peripheral edge 35. The elevation angle (contact angle) αat the peripheral edge 35 of the organic buffer layer 18 with respect to the horizontal direction of the element substrate 20A is preferably 20° or less, and particularly preferably about 10°. Therefore, it may be possible to prevent damage such as cracking or peeling due to the concentration of stress in the gas barrier layer 19 covering the organic buffer layer 18.

The gas barrier layer 19 is formed in a wider region than that of the organic buffer layer 18 so as to completely cover the organic buffer layer 18, and the peripheral seal layer 33 is disposed on the gas barrier layer 19. Further, the rising portion at the peripheral edge 35 of the organic buffer layer 18 is disposed within the width d of the peripheral seal layer 33. Thus, the gas barrier layer 19 covering the peripheral edge 35 of the organic buffer layer 18 is protected by the peripheral seal layer 33, thereby preventing damage such as cracking or peeling due to the concentration of stress in the gas barrier layer 19. Accordingly, moisture is prevented from passing through the gas barrier layer 19 and reaching the light-emitting elements 21, thereby preventing the occurrence of dark spots.

Although, in this embodiment, the gas barrier layer 19 is formed to protrude from the peripheral end of the peripheral seal layer 33, the gas barrier layer 19 is not necessarily formed to protrude from the peripheral end of the peripheral seal layer 33. Namely, like the peripheral edge 35 of the organic buffer layer 18, the peripheral edge 38 of the gas barrier layer 19 may be disposed within the width d of the peripheral seal layer 33 as long as the peripheral edge 38 of the gas barrier layer 19 is disposed outside the peripheral edge 35 of the organic buffer layer 18. In addition, the width of the electrode protecting layer 17 is larger than that of the organic buffer layer 18. Since the electrode protecting layer 17 is generally formed using the same mask material as for the gas barrier layer 19, the electrode protecting layer 17 is formed with the same width as that of the gas barrier layer 19.

The peripheral portion of the organic EL device 2 is used as a frame portion (non-emission portion) D. The frame portion D corresponds to the non-emission portion of the organic EL device 2. For example, the frame portion has a width covering from the pixel partition 13 provided at the end of the element substrate 20A to the end of the element substrate 20A. The frame portion D is formed with a width of, for example, 2 mm, and the width d of the peripheral seal layer 33 is, for example 1 mm.

Like in the first embodiment, in the second embodiment, the peripheral seal layer 33 is disposed on the gas barrier layer 19, and thus it may be possible to obtain the organic EL device A having the narrow frame portion D and also form the organic EL device 1 having excellent heat resistance and moisture resistance as compared with the case in which the peripheral seal layer 33 is disposed outside the gas barrier layer 19. Also, since the bonding area between the element substrate 20A and the sealing substrate 31 is wider than that of a general can-sealed structure, it may be possible to form the peripheral seal layer 33 with the smaller width d while maintaining the strength of the organic EL device 2, thereby decreasing the frame portion D serving as the non-emission portion. Therefore, attempts may be made to miniaturize terminals such as a cellular phone and made compact display bodies of large televisions, thereby causing the effect of improving the degree of design freedom. Also, it may be possible to increase the number of the panels obtained from one mother board, thereby causing the effect of improving the material efficiency.

In order to prevent seal cut-off, the material of a general sealing agent contains inorganic material particles mixed for increasing the viscosity. However, the peripheral seal layer 33 is composed of a material which is gradually increased in viscosity after ultraviolet irradiation, and thus the viscosity is increased by ultraviolet irradiation before bonding between the element substrate 20A and the sealing substrate 31. Therefore, it may be possible to prevent seal cut-off after bonding under reduced pressure while maintaining the high drawing speed of a dispenser.

Further, the filling layer 34 composed of a thermosetting resin is formed in the region surrounded by the peripheral seal layer 33 between the element substrate 20A and the sealing substrate 31, thereby improving the adhesion between the element substrate 20A and the sealing substrate 31 while suppressing the influence of curing shrinkage on each of the function layers such as the gas barrier layer 19 and the layers provide below it. Therefore, it may be possible to prevent the entrance of moisture into the region surrounded by the peripheral seal layer 33 between the element substrate 20A and the sealing substrate 31. Further, it may be possible to fix the sealing substrate 31, provide the buffer function for an external mechanical impact, and protect the luminescent layers 12 and the gas barrier layer 19.

Since the gas barrier layer 19 is composed of a silicon compound, it may be possible to secure transparency, the gas barrier property, and water resistance.

Further, since the contact angle α at the peripheral edge 35 of the organic buffer layer 18 is 20° or less, it may be possible to suppress rising of the peripheral edge 35 and prevent peeling. Also, it may be possible to reduce the irregularity of the gas barrier layer 19 covering the peripheral edge 35 of the organic buffer layer 18, thereby suppressing damage.

The present invention is effective for the top-emission structure and the bottom-emission structure.

(Electronic Apparatus)

Next, examples of an electronic apparatus including the organic EL device according to any one of the embodiments of the invention will be described.

Figure 9A:
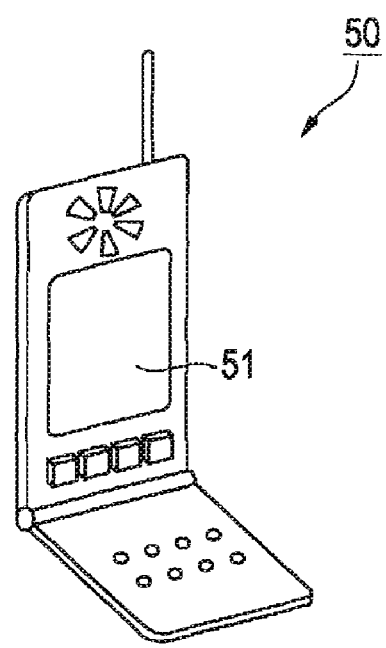
FIGS. 9A, 9B, and 9C are drawings showing electronic apparatuses according an embodiment of the invention.

FIG. 9A is a perspective view showing an example of cellular phones. In FIG. 9A, reference numeral 50 denotes a cellular phone body, and reference numeral 51 denotes a display portion including the organic EL device.

Figure 9B:
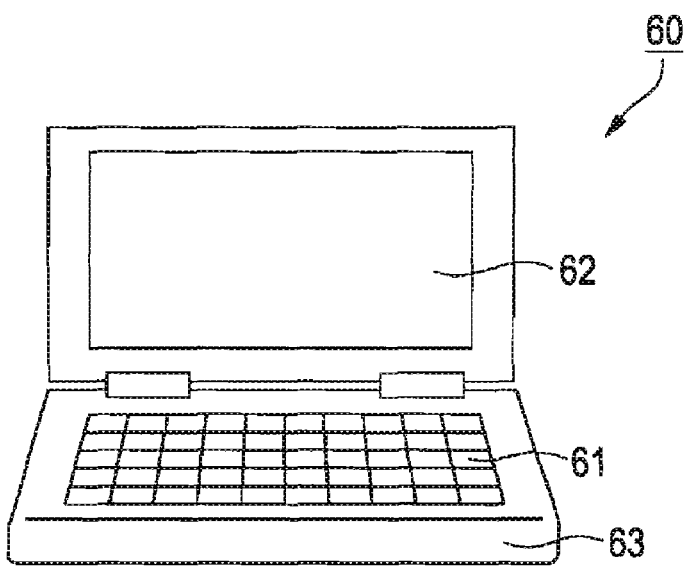

FIG. 9B is a perspective view showing an example of portable information processors such as a word processor and a personal computer. In FIG. 9B, reference numeral 60 denotes an information processor; reference numeral 61, an input portion such as a keyboard; reference numeral 63, an information processing body; and reference numeral 62, a display portion including the organic EL device.

Figure 9C:
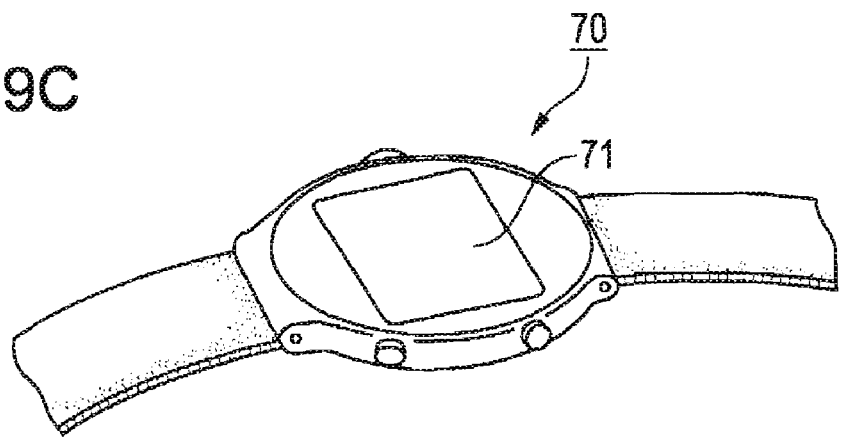

FIG. 9C is a perspective view showing an example of wristwatch-type electronic apparatus. In FIG. 9C, reference numeral 70 denotes a watch body, and reference numeral 71 denotes an EL display portion including the organic EL device.

Each of the electronic apparatuses shown in FIGS. 9A to 9C includes the organic EL device according to any one of the above-described embodiments and thus has excellent display characteristics.

Electronic apparatuses are not limited to these electronic apparatuses, and the invention may be applied to various electronic apparatuses. Examples of the electronic apparatuses include a desktop computer, a liquid crystal projector, a multimedia personal computer (PC), an engineering workstation (EWS), a pager, a word processor, a view-finder-type or monitor direct-view-type video tape recorder, an electronic notebook, a desktop electronic calculator, a car navigator, a POS terminal, and a device provided with a touch panel.

The entire disclosure of Japanese Patent Application No. 2006-234569, filed Aug. 30, 2006 is expressly incorporated by reference herein.

What is claimed is:

1. An organic electroluminescence device comprising:
    an element substrate including a plurality of light-emitting elements each having an organic luminescent layer held between a pair of electrodes;
    a sealing substrate opposed to the element substrate; and
    a peripheral seal layer provided in the peripheral portion between the element substrate and the sealing substrate, for fixing the element substrate and the sealing substrate;
    wherein an electrode protecting layer covering the light-emitting elements, an organic buffer layer covering the electrode protecting layer, and a gas barrier layer covering the organic buffer layer are formed;
    the gas barrier layer is formed so as to cover the organic buffer layer;
    the peripheral seal layer is provided on a top surface of the gas barrier layer;
    a peripheral edge of the organic buffer layer is disposed within the width of the peripheral seal layer; and
    the gas barrier layer extends outside of outer periphery of the peripheral seal layer.

2. The organic electroluminescence device according to claim 1,
    wherein the peripheral seal layer is composed of an ultraviolet curable resin.

3. The organic electroluminescence device according to claim 1,
    wherein an adhesive layer comprising a thermosetting resin is formed in an inner region surrounded by the peripheral seal layer between the element substrate and the sealing substrate.

4. The organic electroluminescence device according to claim 1,
    wherein the peripheral seal layer contains spherical particles with a predetermined particle size for controlling the distance between the element substrate and the sealing substrate, the particles comprising an organic material.

5. The organic electroluminescence device according to claim 3,
    wherein the adhesive layer contains spherical particles with a predetermined particle size for controlling the distance between the element substrate and the sealing substrate, the particles comprising an organic material.

6. The organic electroluminescence device according to claim 1,
    wherein a plurality of colored layers and a black matrix layer are formed on the sealing substrate, and the peripheral seal layer is arranged so as to overlap the black matrix layer.

7. The organic electroluminescence device according to claim 1,
wherein pixel partition walls which divide the plurality of light-emitting elements are formed on the element substrate,
a plurality of colored layers and a black matrix layer are formed on the sealing substrate,
the peripheral seal layer is arranged outside an edge-most pixel partition wall among the pixel partition wall, and
the black matrix layer is arranged between the peripheral seal layer and edge-most pixel partition wall and is not arranged in a region overlapping the peripheral seal layer.

8. The organic electroluminescence device according to claim 1,
wherein outside of the region in which the organic buffer layer is arranged, the electrode protecting layer contacts the gas barrier layer.

9. A method of manufacturing an organic electroluminescence device including an element substrate including a plurality of light-emitting elements each having an organic luminescent layer held between a pair of electrodes, and a sealing substrate opposed to the element substrate, the method comprising:
forming an electrode protecting layer covering the light-emitting elements on the element substrate;
forming an organic buffer layer covering the electrode protecting layer;
forming a gas barrier layer covering the organic buffer layer;
applying a material for forming a peripheral seal layer on the sealing substrate; and
bonding the element substrate and the sealing substrate so that a peripheral edge of the organic buffer layer is disposed within the width of the peripheral seal layer, and the gas barrier layer extends outside an outer periphery of the peripheral seal layer, wherein the peripheral seal layer is provided on a top surface of the gas barrier layer.

10. The method of manufacturing an organic electroluminescence device according to claim 9, further including the steps of:
forming a plurality of colored layers and a black matrix layer on the sealing substrate,
wherein the step of forming the peripheral seal layer on the sealing substrate includes a step of applying an ultraviolet curable resin used as the material for forming the peripheral seal layer at a position overlapping the black matrix layer, a step of applying a thermosetting resin used as a material for forming an adhesive layer inside the peripheral seal layer, and a step of irradiating the peripheral seal layer with ultraviolet light before a step of bonding the element substrate and the sealing substrate; and
the step of bonding the element substrate and the sealing substrate includes a step of bonding the element substrate and the sealing substrate under reduced pressure during curing of the peripheral seal layer, and a step of heating the peripheral layer and the adhesive layer and curing in air.

11. An electronic apparatus comprising an organic electroluminescence device according to claim 1.

12. The organic electroluminescence device according to claim 1, wherein the peripheral seal layer is disposed so as to not overlap the light-emitting elements in plan view.

13. The method of manufacturing an organic electroluminescence device according to claim 9, wherein the peripheral seal layer is disposed so as to not overlap the light-emitting elements in plan view.

* * * * *